US007319418B2

(12) United States Patent
Fink

(10) Patent No.: US 7,319,418 B2
(45) Date of Patent: Jan. 15, 2008

(54) SENSOR WITH MULTIPLEX DATA OUTPUT

(75) Inventor: Hans-Joerg Fink, Frieburg (DE)

(73) Assignee: Micronas GmbH, Freiburg (DE)

( * ) Notice: Subject to any disclaimer, the term of this patent is extended or adjusted under 35 U.S.C. 154(b) by 387 days.

(21) Appl. No.: 11/057,711

(22) Filed: Feb. 14, 2005

(65) Prior Publication Data

US 2005/0243184 A1 Nov. 3, 2005

(30) Foreign Application Priority Data

Feb. 13, 2004 (DE) ..................... 10 2004 007 486

(51) Int. Cl.
*H03M 1/00* (2006.01)

(52) U.S. Cl. ...................... 341/110; 341/126; 341/141; 324/718; 702/130

(58) Field of Classification Search ................ 341/110
See application file for complete search history.

(56) References Cited

U.S. PATENT DOCUMENTS

| | | | | |
|---|---|---|---|---|
| 4,494,183 A | | 1/1985 | Bayer et al. | |
| 4,591,855 A | | 5/1986 | Blackburn | 340/870.13 |
| 4,592,002 A | * | 5/1986 | Bozarth et al. | 702/107 |
| 4,978,956 A | * | 12/1990 | Berresheim | 341/155 |
| 5,361,218 A | * | 11/1994 | Tripp et al. | 702/88 |
| 5,481,200 A | * | 1/1996 | Voegele et al. | 324/718 |
| 5,815,100 A | | 9/1998 | Rush et al. | 341/410 |
| 6,289,055 B1 | | 9/2001 | Knotz | 375/286 |
| 6,744,376 B1 | * | 6/2004 | Pascalidis | 340/870.21 |
| 7,243,535 B2 | * | 7/2007 | Shimura | 73/146.5 |
| 2002/0082799 A1 | * | 6/2002 | Pramanik | 702/130 |
| 2004/0128043 A1 | | 7/2004 | Weichenberger | 701/45 |
| 2004/0133829 A1 | | 7/2004 | Hummel | 714/724 |
| 2005/0052179 A1 | | 3/2005 | Herzer | |

FOREIGN PATENT DOCUMENTS

| | | | |
|---|---|---|---|
| DE | 23 30 263 A1 | 6/1973 | 72/169 |
| WO | WO 92/09 153 | 10/1991 | |
| WO | WO 01/24441 A2 | 7/2000 | |

* cited by examiner

*Primary Examiner*—Khai M. Nguyen
(74) *Attorney, Agent, or Firm*—O'Shea, Getz & Kosakowski, P.C.

(57) ABSTRACT

A method of transmitting data from a sensor (1) to a receiver (4) in which each original data word is split in positional fashion into at least two separate short data words (MSN, LSN). The separate short data words (MSN, LSN) are each converted by digital-to-analog conversion (15) into an analog pseudosignal and transmitted in a multiplex mode via an output of the sensor and a transmission path (3) to the receiver (4). In the receiver, the analog pseudosignals are converted back into short data words (MSN, LSM) and joined together in correct bit sequence by means of an analog-to-digital converter (15), so that the resulting data word corresponds to the original word.

13 Claims, 4 Drawing Sheets

SENSOR WITH MULTIPLEX DATA OUTPUT

BACKGROUND OF THE INVENTION

The present invention relates to the field of sensors and in particular to sensors with multiplex data output.

Sensors are generally located at the place of the quantity to be measured. This either is required by the measuring principle itself or serves to keep measurement errors and uncertainties to a minimum. In the sensor, the measured quantities, such as temperature, magnetic field, pressure, force, flow rate, filling level, etc., are converted into physical signals which are then fed to the receiving device. As a rule, a conversion into electric signals takes place in the sensor, which signals are easy to generate, transmit, and receive, particularly if the receiver is a processor having appropriate interfaces. The signals to be transmitted can be analog or digital signals, depending on the application. Digital signals have the advantage of being less susceptible than analog signals to interference on the transmission path, but the price paid for this is increased complexity at the transmitting and receiving ends as well as on the transmission path. On the other hand, digital signals frequently fit better into the "signal landscape" of the associated processors, because the signal processing of the latter is substantially digital as well.

To avoid parallel data lines on the transmission path and corresponding parallel connections at the sensor and receiver ends, the data are often transmitted serially. Transmission is effected as a continuous data stream or as data packets separated in time. In the simplest form, the individual bits of the data are encoded by two easily distinguishable logical states and transmitted. There are plenty of known methods, the most widely known being pulse-code modulation (PCM) and pulse-width modulation (PWM), which are both binary modulation methods. Whether a carrier modulation is added does not alter this basically binary modulation scheme.

In the case of longer data words, one disadvantage of serial data transmission is the time needed for transmission, because the transmission rate is relatively slow. Long signal lines may round the pulse edges, reliable detection requires a significantly reduced data rate in comparison with the processor clock rate. As a rule, at least the associated data input of the receiver is blocked for other data during this time; in the worst case, the blocking extends to further portions of the processor, which then does not permit an interrupt, for example.

Another possibility for fast transmission of data is to reconvert the data prior to transmission into an analog signal with discrete values using a digital-to-analog converter, and to transmit this signal. This corresponds to parallel data transmission. At the receiver end, the data can then be recovered from the individual signal ranges by an analog-to-digital converter. At first sight this looks complicated, for the obvious thing to do would be to transmit the sensor's original analog output signal. If, however, processing of the sensor signal, e.g., filtering, interpolation, compensation, level adaptation, equalization, etc., takes place in the sensor, this is accomplished much more easily at the digital level, because then the associated parameters and program steps are retrievable from digital memories and the digital processing is performed in on-chip computing devices. Problems are encountered with this transmission method in the case of high-resolution sensor output signals, because then the interference variables on the transmission path are comparable to or even greater than the step width of the available signal grid.

There is a need for a system and method which permits fast and in particular reliable data transmission between the sensor and receiver even if a high resolution sensor is used.

SUMMARY OF THE INVENTION

This object is achieved through recognition that for transmission, not all data are simultaneously converted into an analog signal, a pseudosignal, but the data are converted in sections. The resulting analog signals are then transmitted in sequence in a multiplex mode. At the receiver end, the bits determined from the transmitted pseudosignals are joined together in correct sequence, so that the complete data word is available for further processing.

The number of multiplex sections and the number of data transmitted in each multiplex section are dependent on the respective characteristics of the functional units involved and on the interference to be expected. If the interference effect is low, this will permit more discretely distinguishable states than if the interference effect is high. In the limiting case, the interference effect is so high that multiplex transmission is no longer possible, but that each bit has to be transmitted separately; this, however, is the purely sequential mode.

At the receiver end, the data packets transmitted in a multiplex mode must be correctly reassembled. There must therefore be a reliable assignment telling which of the several data packets is which. This can be accomplished in many ways. A very simple solution is an identification by short intervals between those multiplex sections of a single data word which belong together, and by long intervals which serve to distinguish between different data words. In that case, the order of the data packets belonging together is fixed.

A big advantage of the multiplex transmission described is that even high-resolution sensor signals can be handled by the lower-resolution analog-to-digital converters in the processors. If a 14-bit data word is split into two 7-bit sections, a 10-bit analog-to-digital converter in the processor will be capable of resolving this signal and determining the associated 7 bits. The first 7 bits, which are assigned to the high- or low-order positions of the data word, are placed in a first register. In the second received signal, the 7 bits assigned to the low- or high-order positions of the data word are determined and stored in a second register or in free positions of the first register in correct sequence. The transmission of a 14-bit data word is thus carried out in two steps. Further processing then takes place in the processor as a 14-bit data word. One example of the requirement for high transmission accuracy is the sensing of the exact throttle position in an internal combustion engine, which is necessary for the adjustment of smooth idling.

Assuming the supply voltage for the electronics to be the usual 5 volts, an output voltage range between roughly 0.25 V and 4.75 V is available for the sensors. If a 10-bit resolution is to be achieved with this voltage range, the smallest resolution step, one least significant bit (LSB), will correspond to a voltage step of 4.88 mV. If, however, this transmission range is used for a multiplex transmission of 2 times 5 bits in accordance with the invention, the smallest resolution step LSB will correspond to a voltage step of 62.25 mV. This is a gain by a factor of about 30 over the original resolution.

The example shows that as a rule, transmission with two steps is sufficient, which simplifies the methods for identifying the two sections. For example, the available voltage range between 0.25 V and 4.75 V can be split into two parts of 0.25 V to 2.25 V and 2.75 V to 4.75 V. Then, the high-order bits are transmitted in one range and the low-order bits in the other. Noise immunity is halved, but it is still about a factor of 15 higher than in the above example of the transmission of a 10-bit signal.

The definition of or request for the respective data range can, however, also be effected by the controller itself in that the controller connects a load resistor of the transmission line via one of its I/O ports to the VSS or VDD potential. This switching is detected via the changed current direction in a suitable evaluating circuit in the sensor output and triggers the transfer of the desired data section. Another possibility of defining the data packets and, if necessary, triggering the same is to use signals on the supply line VDD or at a further terminal of the sensor. DE 198 19 265 C1 describes, for example, how command signals from an external controller are fed to a sensor via the supply voltage terminal VDD. In the simplest case, a relatively high VDD voltage value triggers the transmission of the high-order data and a relatively low VDD voltage value triggers the transmission of the low-order data or vice versa.

If the rate of change of the quantity to be measured by the sensor is relatively slow, the data in the high-order range will not change, but only the data in the low-order range will. In that case it is appropriate to transmit only the changes in the low-order data range until a change occurs in the high-order data range. If the transmission takes place in two dynamic ranges, the identification as to which data section is being transmitted is guaranteed; otherwise another kind of identification must ensure this. This method further increases the transmission speed and reduces the loading of the controller.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
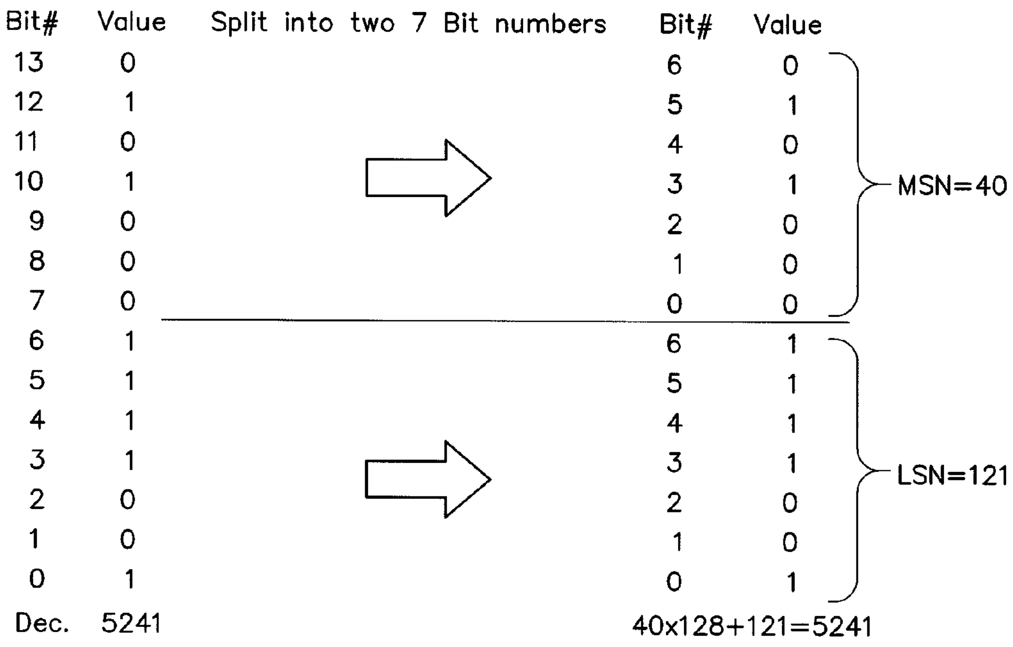
FIG. 1 shows the splitting of 14 bits into two 7-bit short data words.

FIG. 1 shows the output signal of a sensor with 14-place or 14-bit resolution in tabular form. The bit range ("Bit #") running from bit 0 to 13, which defines a binary number, corresponds to 16,384 distinguishable signal ranges. In the example shown, the sensor signal value is assumed to be the decimal number 5241; the associated binary value is given under "value". If this binary number is split into two 7-bit ranges, the new binary values MSN and LSN given in the right-hand "value" column are obtained. MSN stands for "most significant nibble" and LSN for "least significant nibble". In decimal numbers, MSN corresponds to the value 40 and LSN to the value 121. In the following description and in the claims, these subranges MSN and LSN are also referred to as "short data words". At the bottom right, a formula illustrates that the two short data words can be additively recombined into the original decimal value 5241 if the decimal MSB value 40 is first increased with respect to the LSN value by applying the weighting factor 128.

Figure 2:
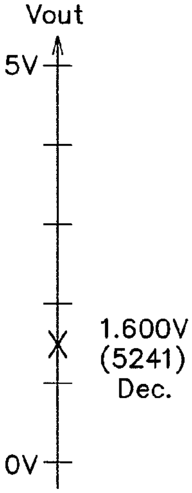
FIG. 2 shows the dynamic range for an analog output signal.
Figure 3:
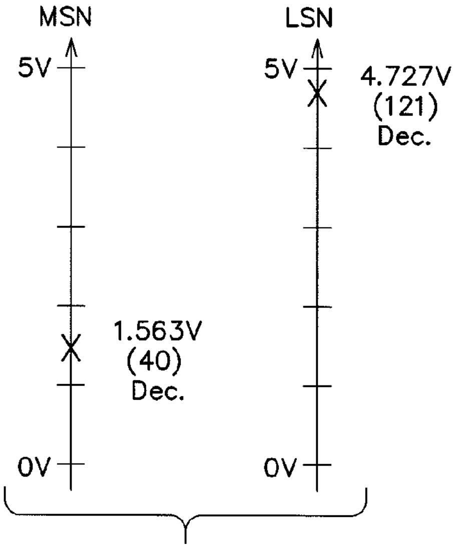
FIG. 3 shows the output ranges for the associated analog pseudosignals.

In FIG. 2, the decimal value 5241 is mapped onto the output voltage ranging from 0 V to 5 V, with the full range corresponding to the decimal value 16,384. The stated voltage range of 0 V to 5 V is shown here for the sake of simplicity; in reality, of course, these values are not reached given a supply voltage of VDD=5 V. For the decimal value 5241, a voltage value of 1.600 V is obtained. FIG. 3 shows the voltage values for the associated short data words MSN and LSN, which have the values, in decimal notation, of Dec.=40 and 121, respectively. Since, as a result of the splitting, only 128 voltage values have to be distinguished in each case, the decimal values 40 and 121 of the short data words MSN and LSN correspond to the voltage values 1.563 V and 4.727 V, respectively.

Figure 4:
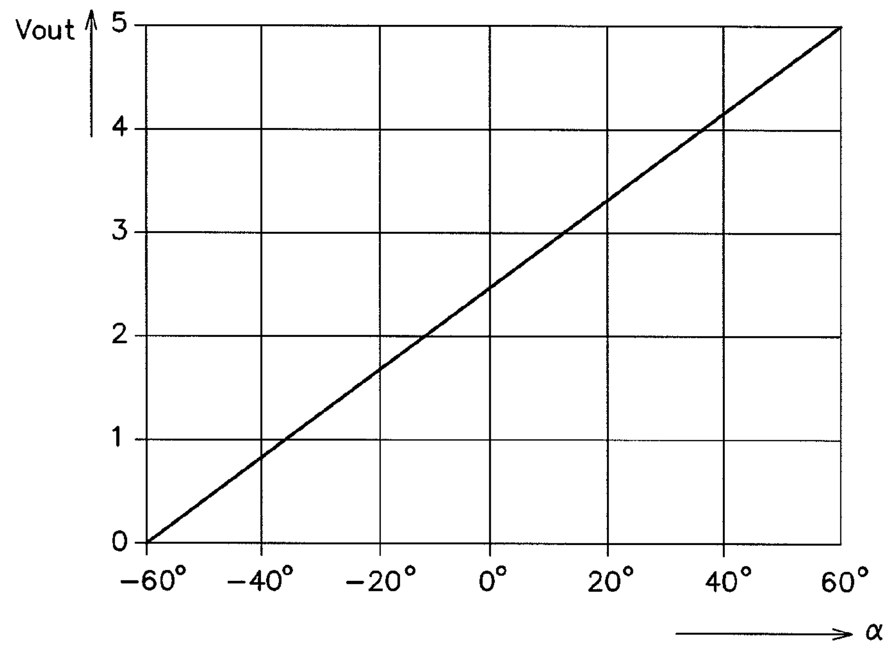
FIG. 4 shows the analog sensor signal for the example of an angular measurement.

FIG. 4 schematically shows the analog output signal Vout of a sensor for measuring angular values. The angles $\alpha$ running from $-60°$ to $+60°$ are linearly associated with the voltage values from 0 to 5 V.

Figure 5:
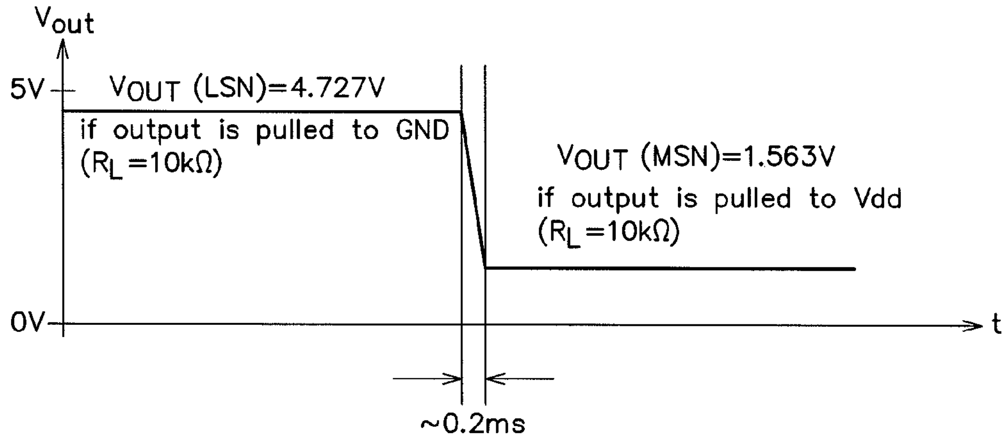
FIG. 5 is a time diagram illustrating the transmission of the pseudosignals of FIG. 3.

FIG. 5 shows in a time diagram the successive transmission of the short data words LSN and MSN of FIG. 1 as distinct voltage levels Vout of 4.727 V and 1.563 V, respectively. A short transition of about 0.2 ms signals the change from LSN to MSN. In the exemplary embodiment, the change is initiated by detecting in the sensor output that the direction of current flow on the transmission line has reversed, which is caused, for example, by switching the load resistor RL from VSS or GND to VDD.

Figure 6:
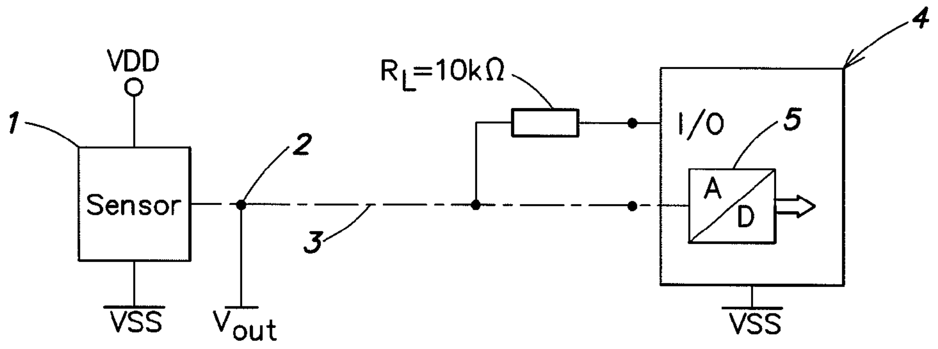
FIG. 6 schematically shows a transmission link with a switchable load.

One example of such an implementation is shown in FIG. 6. A sensor 1 has its signal output 2 connected to a transmission path 3, which contains a load resistor RL of, for example 10 kilohms. The end of the load resistor remote from the transmission path 3 is connected to an I/O input of a receiver 4, (e.g., a controller), which can switch its output potential between VSS and VDD, thus controlling in the sensor 1 the emission of the respective short data word as an analog pseudosignal. The evaluation of the analog pseudosignal in the receiver 4, (i.e., its digitization), is performed by an analog-to-digital converter 5.

Figure 7:
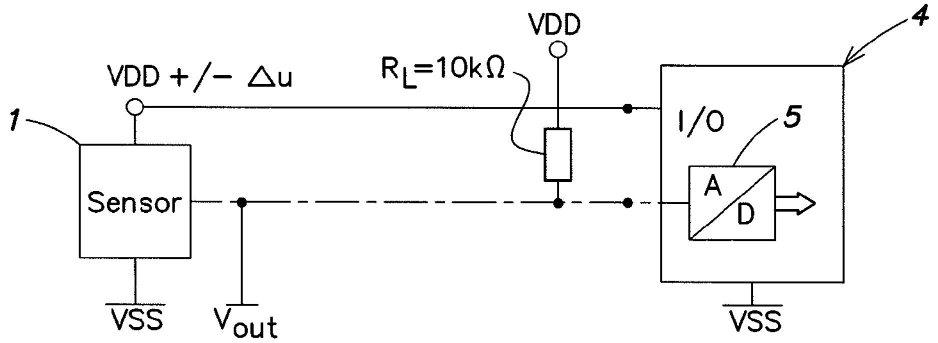
FIG. 7 schematically shows the control of the sensor via the supply.

FIG. 7 schematically shows another implementation of the external triggering of the short data words. Control is now effected via the supply voltage VDD, which is modulated by the controller 4 via the I/O port in a suitable manner. Whether an overvoltage and undervoltage $+/-\Delta U$ or distinct overvoltages are used depends only on the detection circuit in the sensor. In that case, the load resistor is tied to a fixed potential, e.g., VDD.

If the distinction between the short data words MSN and LSN is made via distinct voltage ranges Vout, the identifications according to FIG. 6 or FIG. 7 are, of course, unnecessary. In that case, the distinction is made purely passively in the receiver 4 via the voltage ranges detected as being distinct by the analog-to-digital converter 5.

Figure 8:
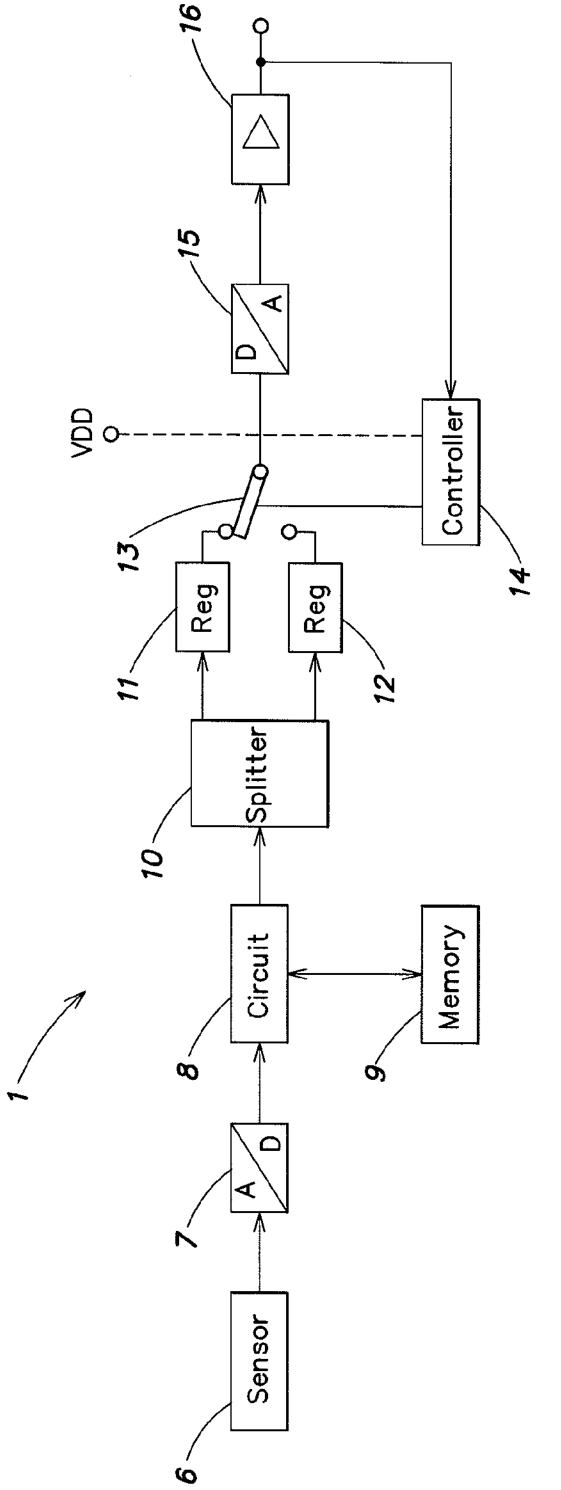
FIG. 8 is a block diagram showing the functional units of a sensor.

FIG. 8 schematically shows the functional units of an exemplary embodiment of a sensor 1 in block-diagram form. A sensing element 6 supplies its analog measurement signal to an analog-to-digital converter 7. The subsequent processing is performed digitally in a circuit block 8. If parameters or program statements are needed for this, they are fetched from a memory 9. The memory may also hold intermediate results, et cetera. The result of the processing is the digital output signal of the circuit block 8, a multibit data word, which is ultimately to be transmitted to a receiver (not shown). In a circuit block 10, this data word is split into two short data words MSN and LSN, which are temporarily stored in registers 11, 12. Via an electronic switching device 13, the contents of the two registers are switched at the correct time, controlled by a controller 14, to a digital-to-analog converter 15, which converts each of the short data words MSN and LSN into an analog pseudosignal, which is passed through an amplifier 16 to an output terminal of the sensor 1. The necessary supply and control lines and clock generators are not shown for the sake of clarity. Whether the individual functional units are implemented wholly or in part by a suitable circuit or by a program is within the scope of the invention.

Although the present invention has been shown and described with respect to several preferred embodiments thereof, various changes, omissions and additions to the form and detail thereof, may be made therein, without departing from the spirit and scope of the invention.

The invention claimed is:

1. A method of transmitting data from a sensor to a receiver, comprising:

splitting each original data word into at least two separate short data words whereby the number of bits in each of the at least two separate short data words becomes less than in the case of the original data word;

converting each of the separate short data words into a respective analog pseudosignal;

multiplexing and transmitting each of the respective analog pseudosignals onto a transmission path;

receiving and digitizing each of the respective analog pseudosignals into receiver-side short data words, the number of bits in the receiver-side short data words being predetermined by the number of bits of the corresponding short data word; and recombining the receiver-side short data words.

2. The method of claim 1, wherein for distinction, the short data words are assigned separate sensor output dynamic ranges.

3. The method of claim 1, wherein for distinction, the short data words are assigned separate directions of current flow in the sensor output.

4. The method of claim 3, wherein the separate direction of current flow is produced by a switchable load resistor on the transmission path whose end remote from the transmission path is switchable between an upper and a lower voltage.

5. The method of claim 4, wherein the switching of the load resistor is effected by an I/O port of the receiver.

6. The method of claim 1, wherein the short data words are retrievable in a well-defined manner by a control signal from the receiver.

7. The method of claim 6, wherein the control signal is fed to the sensor through a separate input or a supply terminal.

8. A sensor having a data output for transmitting a data word formed from a sensor signal to a receiver the sensor comprising:

means for splitting each original data word in positional fashion into at least two separate short data words with a smaller number of bits than that of the original data word;

a multiplexing device controlled by a controller for separating the two separate short data words in time;

a digital-to-analog converter in the signal path after the multiplexing device for converting the separate short data words each into an analog pseudosignal; and an amplifier between the multiplexing device and the output of the sensor, which supplies the necessary power for the transmission.

9. The sensor of claim 8, wherein the number of bits in the at least two separate short data words is equal.

10. A sensor, comprising:

a sensing element that senses a physical parameter and provides a sensed signal indicative thereof;

an analog-to-digital converter that receives the sensed signal and provides a digitized signal indicative thereof;

means for processing the digitized signal and splitting the processed digitized signal into a first short data word and a second short data word; and means responsive to the first short data word and the second short data word for converting the first and second short data words to first and second analog data words respectively, and for time multiplexing the first and second analog data words onto a sensor output line.

11. The sensor of claim 10, wherein the first and second short data words each contains an equal number of bits.

12. The sensor of claim 11, wherein the sum of the number of bits in the first and second analog data words is equal to the number of bits in the processed digitized signal.

13. The sensor of claim 12, wherein said means for multiplexing comprises a switching element.

* * * * *